(12) United States Patent
McQuirk et al.

(10) Patent No.: US 8,981,857 B2
(45) Date of Patent: Mar. 17, 2015

(54) TEMPERATURE DEPENDENT TIMER CIRCUIT

(71) Applicants: Dale J. McQuirk, Austin, TX (US);
Michael T. Berens, Austin, TX (US);
Miten H. Nagda, Austin, TX (US)

(72) Inventors: Dale J. McQuirk, Austin, TX (US);
Michael T. Berens, Austin, TX (US);
Miten H. Nagda, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 212 days.

(21) Appl. No.: 13/678,117

(22) Filed: Nov. 15, 2012

(65) Prior Publication Data
US 2014/0132240 A1    May 15, 2014

(51) Int. Cl.
*H03K 3/03* (2006.01)
*H03K 3/023* (2006.01)
*G06F 1/26* (2006.01)
*G11C 5/14* (2006.01)
*G11C 11/406* (2006.01)
*H03K 3/0231* (2006.01)
*G06F 1/08* (2006.01)
*G06F 1/32* (2006.01)
*G04G 3/04* (2006.01)
*G04F 3/06* (2006.01)

(52) U.S. Cl.
CPC ....... *H03K 3/023* (2013.01); *G04F 3/06* (2013.01); *G06F 1/26* (2013.01); *G11C 5/147* (2013.01); *G11C 11/40626* (2013.01); *H03K 3/0231* (2013.01); *G11C 2211/4065* (2013.01); *G06F 1/08* (2013.01); *G06F 1/3296* (2013.01); *G04G 3/04* (2013.01)

USPC .................................. 331/57; 327/512

(58) Field of Classification Search
USPC ........... 327/79, 100, 142, 198, 512, 543, 307,
327/294, 541; 374/102, 170, 178; 331/57,
331/66, 176, 185
See application file for complete search history.

(56) References Cited

U.S. PATENT DOCUMENTS

| | | | |
|---|---|---|---|
| 4,906,865 A | 3/1990 | Holler | |
| 5,184,218 A | 2/1993 | Gerdes | |
| 5,479,169 A | 12/1995 | Stryjewski | |
| 5,627,970 A | 5/1997 | Keshav | |
| 6,163,225 A | 12/2000 | Sundaram et al. | |
| 6,217,213 B1 * | 4/2001 | Curry et al. | 374/178 |
| 7,031,273 B2 | 4/2006 | Shores et al. | |
| 7,236,061 B2 | 6/2007 | Lin | |
| 7,276,956 B2 * | 10/2007 | Furuta et al. | 327/534 |
| 7,391,196 B2 * | 6/2008 | Fosler | 323/283 |
| 7,405,963 B2 * | 7/2008 | Nemati et al. | 365/159 |
| 7,515,496 B2 | 4/2009 | Matsui et al. | |
| 7,535,309 B2 * | 5/2009 | Maher | 331/176 |
| 7,557,665 B2 | 7/2009 | Chung et al. | |
| 7,583,059 B2 | 9/2009 | Cho | |
| 7,808,331 B2 | 10/2010 | Yamazaki et al. | |

\* cited by examiner

*Primary Examiner* — Rajnikant Patel
(74) *Attorney, Agent, or Firm* — Mary Jo Bertani

(57) ABSTRACT

A timer to provide pulses at a comparator output wherein a frequency of the pulses is dependent on temperature, wherein providing each pulse includes biasing a first input of the comparator at a voltage and operating a transistor in a sub-threshold region of operation to change the voltage of the first input of a comparator at a rate dependent upon temperature. The output of the comparator changes state when the voltage of the first input crosses a voltage of a second input of the comparator.

22 Claims, 4 Drawing Sheets

TEMPERATURE DEPENDENT TIMER CIRCUIT

BACKGROUND

1. Field

This disclosure relates generally to semiconductor devices, and more specifically, to a temperature dependent timer circuit.

2. Related Art

Semiconductor chip level power management systems are increasingly more complex and can require a host of voltage and current references for low power regulation modes. Examples include, voltage and current references for clocks, voltage and current references for accurate regulation control (includes well bias, source bias and core regulation levels), and current and voltage references for other analog blocks such as comparators and band gap circuits that need to run in low power modes.

Some solutions have proposed special very low power dc references but these solutions can be slow starting, less accurate over temperature and are usually just one fixed value. In newer systems a more accurate refreshed sample and hold reference is being used. One advantage to these systems is more flexibility using an add-on digital-to-analog converter (DAC) or resistor ladder and multipliers that are simultaneously refreshed so that multiple references can be generated. Another advantage to this system is any number of voltages can be generated in a refresh period, but power is conserved with everything off in the hold phase which is significantly longer than the sample phase.

One of the constraints to this system is that the refresh rate is done for worst case conditions, for example, high temperatures of 125 degrees C. A low power clock can run constantly to set the refresh rate, but requires power at nominal temperature and involves switching currents and area on the substrate. It is desirable to reduce space and power overhead for lower power sleep modes.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

The present disclosure describes embodiments of semiconductor devices and methods that significantly reduce power consumption in standby and sleep modes in sophisticated power management systems by minimizing power used by a refreshable voltage reference system. In some embodiments, a timer circuit is disclosed that has a near exponential dependence on temperature. The timer can be used for a sample and hold system to minimize refresh power at lower temperature since the refresh period is proportional to the leakage on the sample and hold switches. The circuit also runs on very low power, for example, 10 nA of current.

The phrase "changing a voltage at a rate exponentially dependent upon temperature" as used herein refers to the rate of voltage change by the transistor per change in temperature, increasing as the temperature increases for at least a particular range of operating temperatures.

Figure 1:
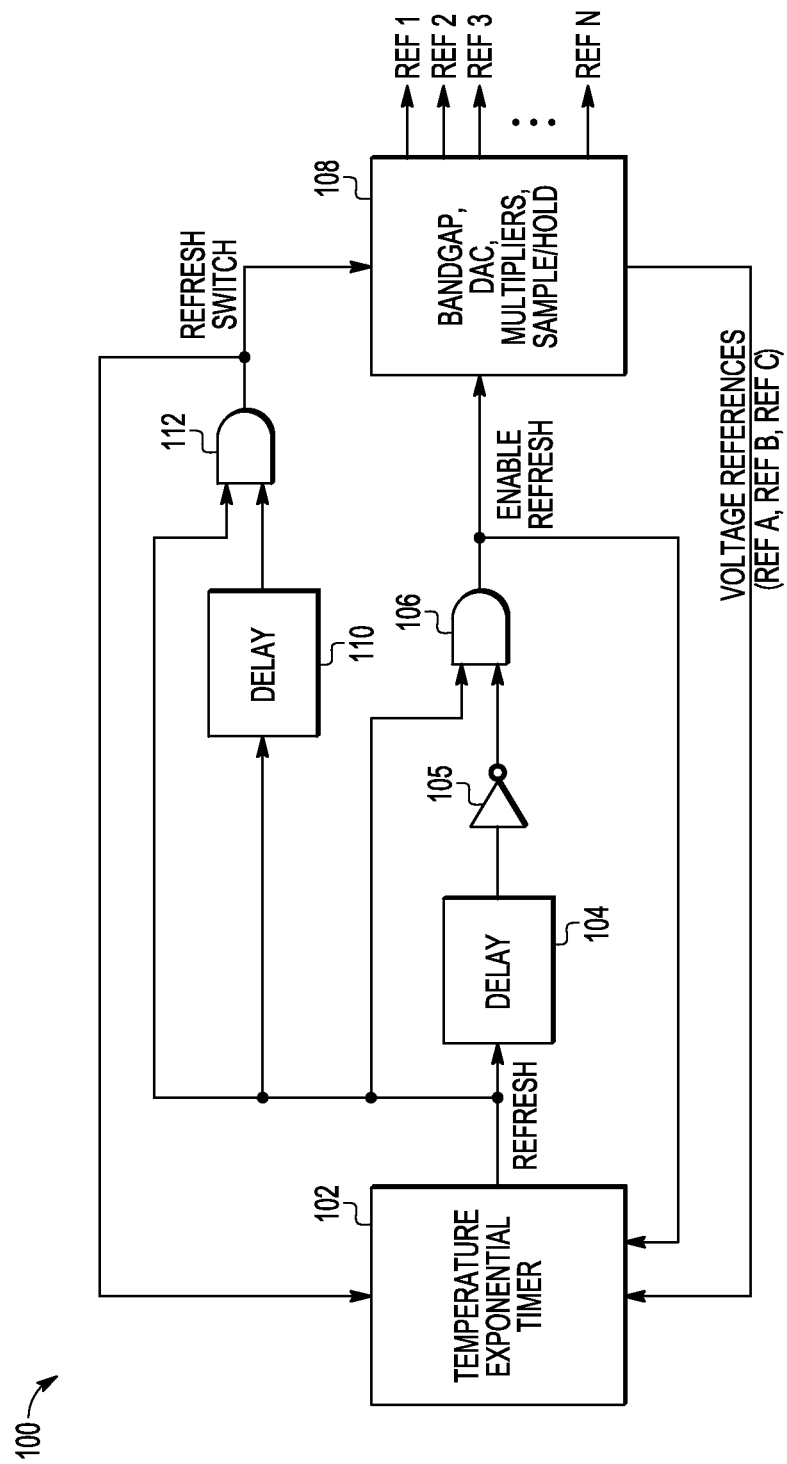
FIG. 1 is a block diagram of an embodiment of a semiconductor device including a exponential to temperature timer in accordance with the disclosure.

FIG. 1 is a block diagram of an embodiment of a semiconductor device 100 including a exponential to temperature timer 102, delay module 104, inverter 105, AND gate 106, reference voltage generator 108, second delay module 110, and AND gate 112. Exponential to temperature timer 102 is coupled to provide a refresh signal to delay module 104, and to receive an enable refresh signal from an output of AND gate 106, voltage references (REFA, REFB, REFC) from reference voltage generator 108, and refresh switch signal from an output of AND gate 112.

The timer 102 generates the refresh signal that is used to trigger an edge to turn on band gap circuitry in reference voltage generator 108 and sample all voltages that need to be stored for the semiconductor device 100, including the three reference voltage signals REFA, REFB, REFC.

Delay module 104 is coupled to receive the refresh signal from exponential to temperature timer 102, and to provide a first delayed refresh signal as an input to inverter 105. The first delayed refresh signal is inverted by inverter 105 and the inverted first delayed refresh signal is provided as an input to AND gate 106. The refresh signal is provided at another input to AND gate 106. An enable refresh signal is output by AND gate 106 and provided to reference voltage generator 108.

Delay module 110 receives the refresh signal as an input from exponential to temperature timer 102 and outputs a second delayed reference signal to AND gate 112. Delay module 104 and delay module 110 can impose different time delays on the refresh signals. For example, delay module 104 imposes a time delay of 16 microseconds on the refresh signal and delay module 110 imposes a time delay of 4 microseconds on the refresh signal. Delay module 110 can be used to allow signals in various circuit components, such as a band gap circuit, to settle into steady state values before being used to generate/refresh reference voltages or other signals. Other time delay values can be used for delay modules 104, 110.

AND gate 112 receives the second delayed refresh signal at a first input and the refresh signal at a second input, and output a refresh switch signal that is provided as input to reference voltage generator 108 and exponential to temperature timer 102.

Reference voltage generator 108 can include a band gap circuit, a resistor ladder or resistor divider, multipliers, sample and hold circuits, and other suitable circuits or components. In the embodiment shown, reference voltage generator 108 receives the enable refresh signal from AND gate 106 and the refresh switch signal from AND gate 112. Reference voltage generator 108 outputs voltage references such as first or "1" through N reference voltage signals (REF1, REF2, REF3 ... REFN) and voltage reference signals (REFA, REFB, REFC) provided to exponential to temperature timer 102.

Figure 2:
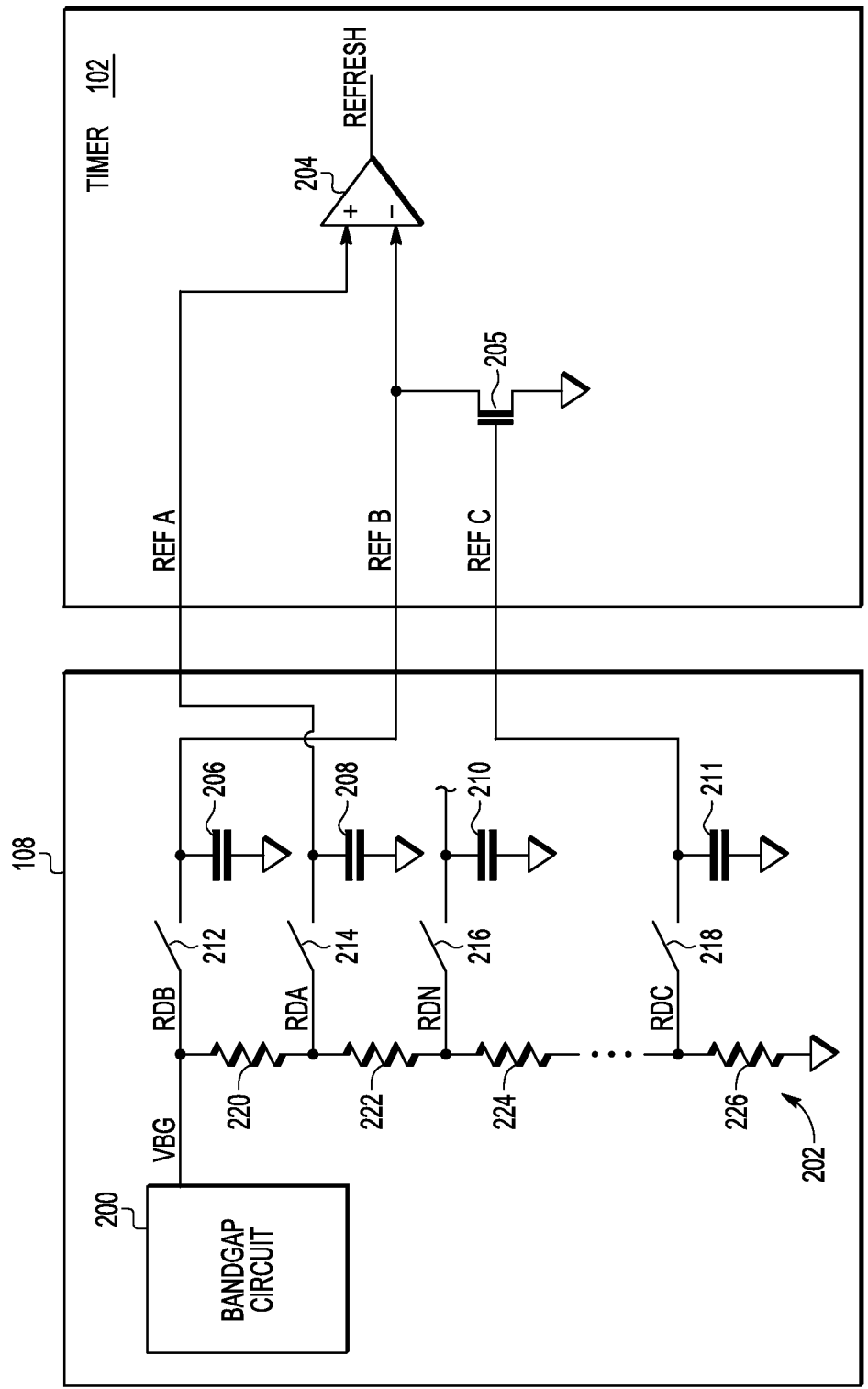
FIG. 2 is a schematic diagram showing further detail of components in the embodiment of the semiconductor device of FIG. 1.

FIG. 2 is a schematic diagram showing further detail of some of the components in the embodiment of the semiconductor device 100 of FIG. 1 including a portion of reference voltage generator 108 and a portion of timer 102. In reference voltage generator 108, band gap circuit 200 outputs a band gap voltage signal VBG to resistor divider 202. Resistor divider 202 includes resistors 220, 222, 224, 226 coupled in series between the VBG signal and ground. The terms "ground" and "VSS" as used herein refer to a voltage level of 0 Volts or a virtual ground signal that is lower than a supply voltage (such as VDD).

A first voltage supply RDB is tapped to the VBG signal. A second voltage supply RDA is tapped between resistors 220 and 222 of resistor ladder 202. A third voltage supply RDN is tapped between resistors 222 and 224 of resistor ladder 202. A fourth voltage supply RDC is tapped between resistors 224 and 226 of resistor ladder 202.

The portion of reference voltage generator 108 shown also includes switches 212-218 and capacitors 206-211. Switch 212 is coupled in series between voltage supply RDB and capacitor 206. One plate of capacitor 206 is coupled to the output of switch 212 and a second plate of capacitor 206 is coupled to ground. A REFB voltage signal is generated by the operation of refresh switch 212 and capacitor 206.

Switch 214 is coupled in series between voltage supply RDA and capacitor 208. One plate of second capacitor 208 is coupled to the output of switch 214 and a second plate of capacitor 208 is coupled to ground. A REFA voltage signal is generated by the operation of refresh switch 214 and capacitor 208.

Switch 216 is coupled in series between voltage supply RDN and capacitor 210. One plate of a third capacitor 210 is coupled to the output of switch 216 and a second plate of capacitor 210 is coupled to ground. A REFN voltage signal is generated by the operation of refresh switch 216 and capacitor 210.

Switch 218 is coupled in series between voltage supply RDC and capacitor 211. One plate of a fourth capacitor 211 is coupled to the output of switch 218 and a second plate of capacitor 211 is coupled to ground. A REFC voltage signal is generated by the operation of refresh switch 218 and capacitor 211.

Note that resistor ladder 202 can include any suitable number of resistors to provide the desired number of reference voltages. The number and type of reference voltages shown in FIG. 2 are only for purpose of example and are not meant to limit the methods and devices disclosed herein.

In the portion of timer 102 shown, the REFA voltage signal is coupled to a positive terminal input of comparator 204. The REFB voltage signal is coupled to a negative terminal input of comparator 204, and to a drain electrode of N-channel MOS transistor 205. A control gate of transistor 205 is coupled to the REFC voltage signal. Comparator 204 outputs the refresh signal.

The REFA voltage signal is a stored constant reference to the comparator 204 that is refreshed every timeout of the timer 102. The REFB voltage signal is a pre-charged voltage that will slowly discharge through the transistor 205 until REFB falls below REFA to assert the output of comparator 204 and start a new refresh cycle. The REFC voltage signal can be a trimmed reference voltage from the band gap circuitry and is a constant value that is refreshed periodically.

The value of the REFC voltage signal is typically below the threshold voltage of transistor 205. For example REFC voltage may be approximately 200 mV, whereas threshold voltage to turn on transistor 205 may be around 600 mV or more. Semiconductor circuit components including transistor 205 typically experience current leakage that varies with temperature. Accordingly, at temperatures where more leakage occurs and higher refresh rates are required to maintain desired levels of reference voltages, transistor 205 can be used to trigger a refresh cycle of reference voltages in reference voltage generator 108. Since the leakage varies with temperature, the frequency of refresh cycles will vary with temperature, thereby saving power by reducing the number of refresh cycles at lower temperatures where leakage is less pronounced than at higher temperatures. By keeping the REFC voltage signal below the threshold voltage of transistor 205, leakage of transistor 205 can still be detected and used to trigger a refresh cycle when the REFB voltage signal reaches a level at or below the level of the REFA voltage signal. The sub-threshold characteristics of transistor 205 will result in a near exponential response in the rate of change of the REFB voltage.

Figure 3:
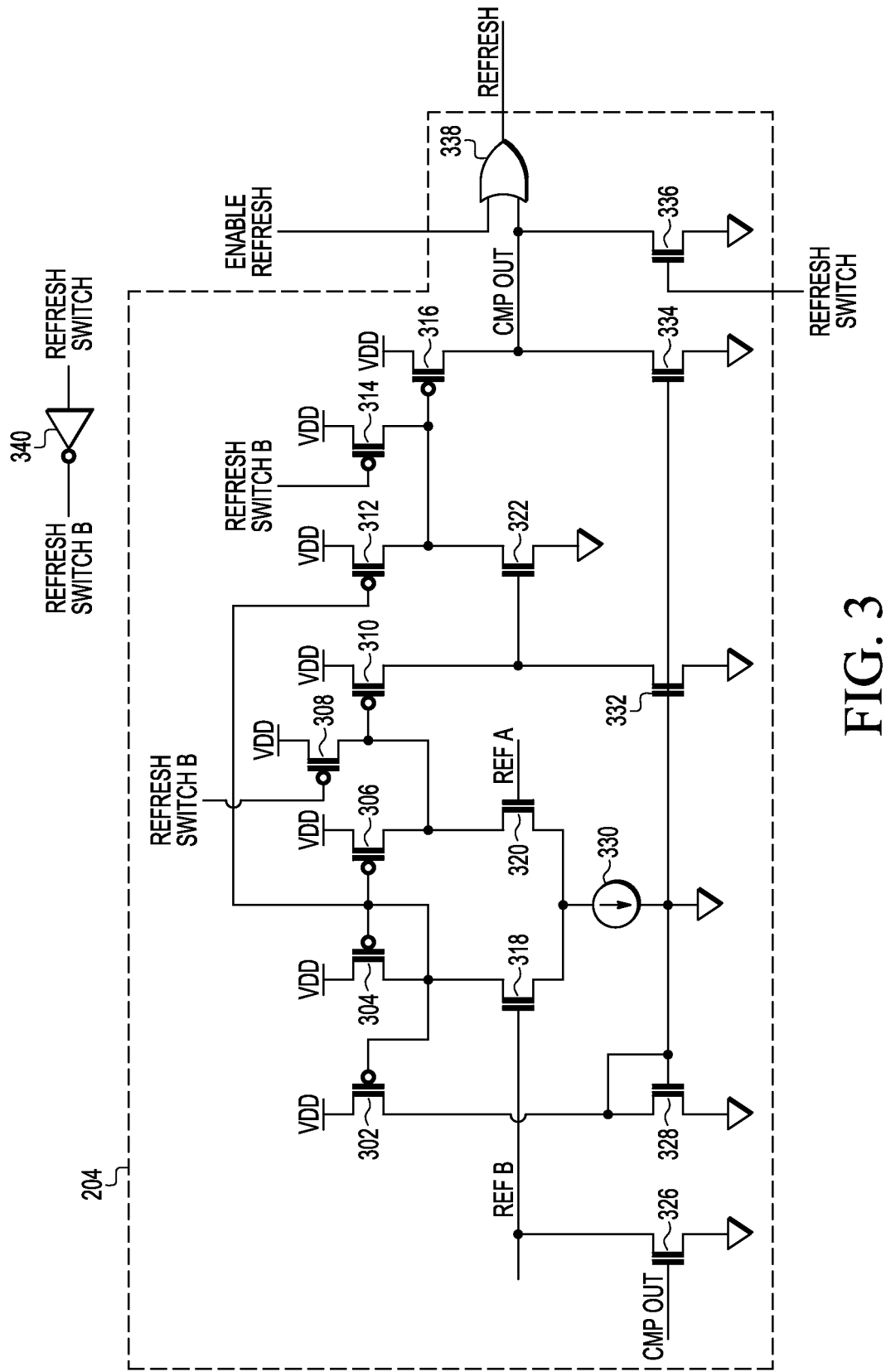
FIG. 3 is a schematic diagram showing further detail of an embodiment of a comparator that may be used in the timer circuit of FIG. 2.

FIG. 3 is a schematic diagram showing further detail of an embodiment of a comparator 204 that may be used in the timer 108 of FIGS. 1 and 2 including P-channel transistors 302-316, N-channel transistors 318-328 and 332-336, OR gate 338, and inverter 340. Source electrodes of P-channel transistors 302-316 are coupled to a supply voltage VDD. Source electrodes of N-channel transistors 322, 326, 328, 332, 334, 336 are coupled to ground.

N-channel transistor 326 further has a drain electrode coupled to the REFB voltage signal and a control gate coupled to a comparator output (CMPOUT) signal.

P-channel transistor 302 further has a drain electrode coupled to a drain electrode of N-channel transistor 328, and a control gate coupled between the drain electrode of P-channel transistor 304 and the drain electrode of N-channel transistor 318.

N-channel transistor 328 further has a control gate coupled to control gates of N-channel transistors 332 and 334. The control gate of N-channel transistor 328 is also coupled to the drain electrode of N-channel transistor 328.

P-channel transistor 304 further has a control gate coupled to the control gates of P-channel transistors 306 and 312 and a drain electrode coupled to a drain electrode of N-channel transistor 318. The control gate of P-channel transistor 304 is also coupled to the drain electrode of P-channel transistor 304.

N-channel transistor 318 further has a control gate coupled to the REFB voltage signal and a source electrode coupled to the source electrode of N-channel transistor 320.

Tail current source 330 is coupled between the source electrodes of N-channel transistors 318, 320 and ground.

P-channel transistor 306 further has a control gate coupled to the control gate of P-channel transistor 304 and a drain electrode coupled to a drain electrode of N-channel transistor 320.

N-channel transistor 320 further has a control gate coupled to the REFA voltage signal and a source electrode coupled to the source electrode of N-channel transistor 318.

P-channel transistor 308 has a gate electrode coupled to the complement of the refresh switch signal, and a drain electrode coupled between the drain electrode of P-channel transistor 306 and the drain electrode of N-channel transistor 320.

P-channel transistor 310 has a control gate coupled to the drain electrode of P-channel transistor 308 and a drain electrode coupled to the drain electrode of N-channel transistor 332 and the control gate of transistor 322.

N-channel transistor 332 has a control gate coupled the control gates of N-channel transistors 328 and 334, and a drain electrode coupled to the drain electrode of P-channel transistor 310.

P-channel transistor 312 has a control gate coupled the control gates of P-channel transistors 302, 304 and 306 and a drain electrode coupled to the drain electrode of transistor 322.

N-channel transistor 322 has a control gate coupled between the drain electrodes of P-channel transistor 310 and N-channel transistor 332 and a drain electrode coupled to the drain of transistor 312.

P-channel transistor 314 has a control gate coupled to a complement of the refresh switch signal, and a drain electrode coupled between a control gate of transistor 316 and drain electrodes of P-channel transistor 312 and N-channel transistor 322.

P-channel transistor 316 has a control gate coupled between drain electrodes of P-channel transistors 312, 314 and N-channel transistor 322 and a drain electrode coupled to the drain electrode of N-channel transistor 334.

The comparator output signal CMPOUT is taken as the signal between the drain electrodes of P-channel transistor 316 and N-channel transistor 334.

N-channel transistor 336 further has a control gate coupled the refresh switch signal, and a drain electrode coupled to the comparator output signal CMPOUT that is coupled to an input of the OR gate 338. A second input to OR gate 338 is coupled to the enable refresh signal.

An input to inverter 340 receives the refresh switch signal and the output of inverter 340 is the complement of the refresh switch signal.

The operation of comparator 204 will now be described with reference to timing diagrams for various signals shown in FIG. 4. The step segments of the signals at "high" voltage or logic "high" in the timing diagrams are also referred to as "pulses" herein. A time history of the relationship of the REFB voltage signal to the REFA voltage signal through a refresh cycle is shown in diagram 402. The REFA voltage signal remains relatively constant at a specified level over time. In the example shown, the REFA voltage signal has a constant value of 0.4 Volts. The REFB voltage signal declines linearly over time until it reaches a value equal to the value of the REFA voltage signal.

Transistors 302, 304, 306, 310, 318, 320, 328 and 332 and tail current source 330 form a push-pull comparator. Transistors 312, 322 form a first inverter and transistors 316, 334 form a second inverter. The discharging of the REFB voltage signal occurs gradually over time. The first and second inverters act as current-starved inverters and are used to prevent slow signals from the push-pull comparator 204 from being input to OR gate 338 until the REFB voltage signal is less than or equal to the REFA voltage signal.

When the value of the REFB voltage signal reaches the value of the REFA voltage signal, the value of the comparator output signal CMPOUT goes high as shown in diagram 404. A high value of the CMPOUT signal at the gate of transistor 326 causes transistor 326 to conduct and draw the value the REFB voltage signal to ground, further below the value of the REFA voltage signal.

With the CMPOUT signal at a high value at an input to OR gate 338, the OR gate 338 outputs a high value for the refresh signal.

Figure 4:
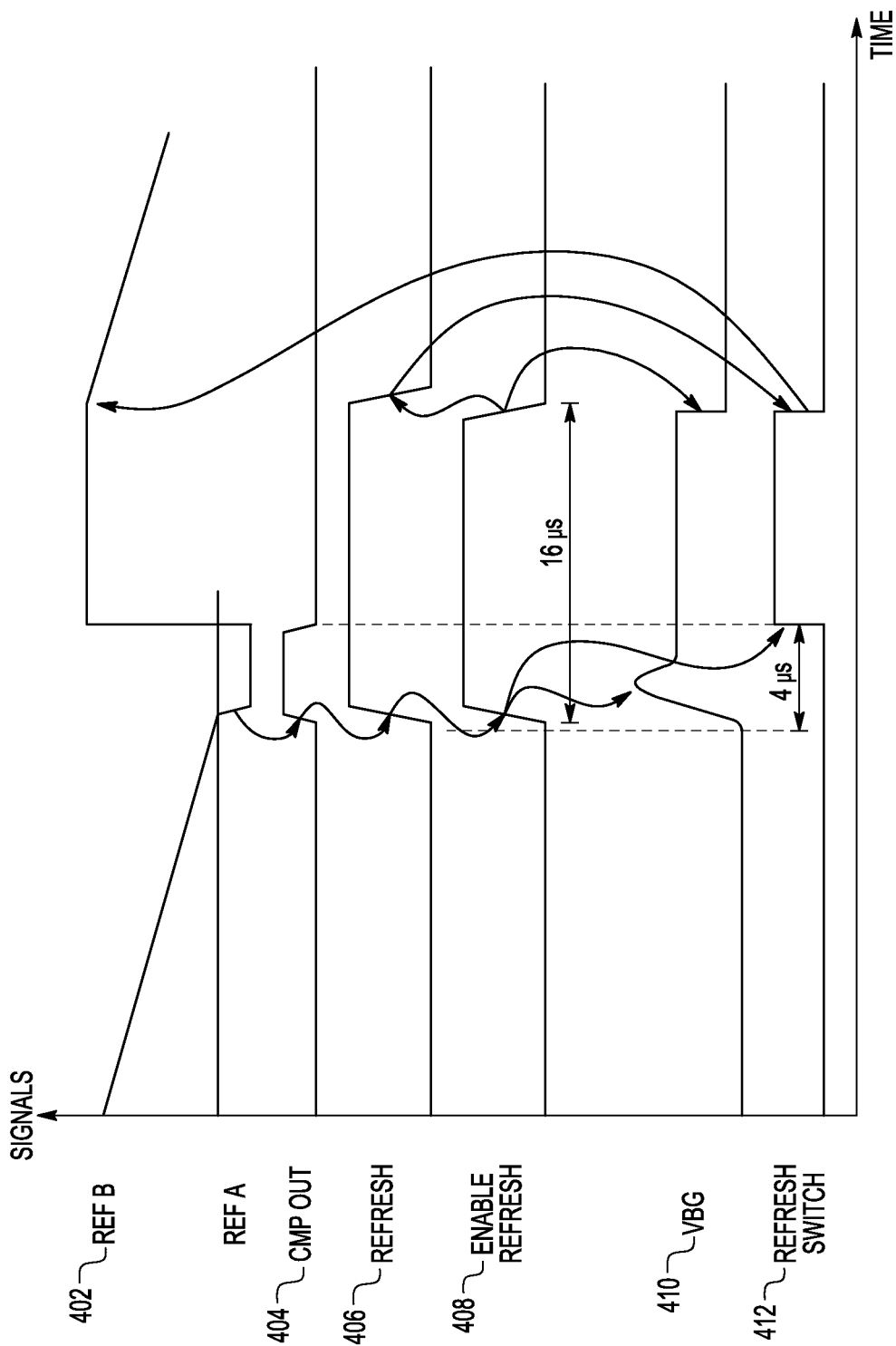
FIG. 4 illustrates examples of timing diagrams for various signals used in the semiconductor device of FIG. 1.

Referring to FIGS. 1 and 4, the refresh signal is coupled to a first input of AND gate 106, and to delay module 104. Delay module 104 outputs a low value until a specified amount of time passes. The low value is inverted to a high value by inverter 105 and provided as a second input to AND gate 106. With both inputs to AND gate 106 high, the output of AND gate 106, which in the enable refresh signal shown in diagram 408 is also high. The band gap voltage VBG is refreshed when the enable refresh signal is high, as shown in diagram 410.

An additional delay can be introduced by delay module 110 to provide sufficient time for the value of the band gap voltage signal VBG to settle to a steady state value. To implement the "settling" delay, the refresh signal is provided as input to delay module 110 and AND gate 112. The output of delay module 110 will be low for a second specified amount of time, such as 4 microseconds or other suitable value, even though the value of the refresh signal is high. The value of the refresh signal will be passed through to AND gate 112 once the second specified amount of time expires. With both the inputs to the AND gate 112 high, the output of AND gate 112, which is the refresh switch signal, will be high, as shown in FIG. 412.

The refresh switch signal is inverted using inverter 340 and provided to the control gates of transistors 308 and 314. The refresh switch signal is provided to the control gate of transistor 336. When the gate of transistor 336 is activated, transistor 336 draws the voltage of the comparator output signal CMPOUT to ground, thereby de-activating the control gate of transistor 326 and allowing the voltage signal REFB to be refreshed by reference voltage generator 108.

Once the first specified amount of time used in delay module 104 expires, the delay module 104 allows the refresh signal to pass to inverter 105. Once inverter 105 inverts the high refresh signal to a low value, the output of the AND gate 106 will go low, ending the refresh cycle, as shown in diagrams 402, 408, 410, and 412. The voltage signal REFB is then allowed to decay gradually until it reaches the value of the voltage signal REFA, which will initiate the state of another refresh cycle, and so on.

Note that the time when each refresh cycle begins depends on the speed at which the voltage signal REFB discharges until it reaches the value of voltage signal REFA. The speed of decay is proportional to the subthreshold leakage of transistor 205 (FIG. 2), which will vary with temperature. The variation in the speed of decay may be exponential or approximately exponential with the rate of leakage increasing as the temperature increases. Thus, the frequency of the refresh cycles is proportional to temperature thereby conserving power by refreshing reference voltages only when necessary.

By now it should be appreciated that in some embodiments, there has been provided a circuit with a temperature dependent timer comprising a comparator including a first input, a second input, and an output, the output to provide a timer signal during operation; a transistor including a first current terminal and a control terminal, the first current terminal coupled to the second input of the comparator; a first node coupled to the first input of the comparator; a second node coupled to the second input of the comparator and the first current terminal of the transistor; and a third node coupled to the control terminal of the transistor. During operation, the third node is biased to place the transistor in a subthreshold region of operation to change a voltage of the second node at a rate dependent upon temperature. The output of the comparator changes state when the voltage of the second node crosses a voltage of the first node.

In another aspect, during operation, the third node can be biased to place the transistor in a subthreshold region of operation to change a voltage of the second node at a rate exponentially dependent upon temperature.

In another aspect, the circuit can further comprise a band gap generator. The change in state of the comparator output can be utilized to activate the band gap generator to provide a voltage.

In another aspect, during operation, the output of the comparator provides pulses, wherein a frequency of the pulses is dependent on temperature.

In another aspect, the circuit can further comprise a first capacitor including a first terminal coupled to the first node; a second capacitor including a first terminal coupled to the second node; a third capacitor including a first terminal coupled to the third node; and a band gap generator. The change in state of the output of the comparator can be utilized to activate the band gap generator to provide a voltage at a generator output. The voltage at the output can be used to charge the first capacitor, the second capacitor, and the third capacitor for a period of time.

In another aspect, the circuit can further comprise a first switch coupled between the generator output and the first capacitor, a second switch coupled between the generator output and the second capacitor, and a third switch coupled between the generator output and the third capacitor. During operation, the first switch, the second switch, and the third switch are closed at a time based on the change of state of the output of the comparator to charge the first capacitor, the second capacitor, and the third capacitor respectively, with the voltage provided at the generator output.

In another aspect, the generator output can be coupled to a resistor ladder, the first switch can be connected to a first node of the resistor ladder, the second switch can be connected to a second node of the resistor ladder, and the third switch can be connected to a third node of the resistor ladder.

In another aspect, the circuit can further comprise a first capacitor including a first terminal coupled to the first node; a second capacitor including a first terminal coupled to the second node; and a third capacitor including a first terminal coupled to the third node. During operation, the first capacitor, second capacitor, and third capacitor are charged at a frequency that can be dependent upon the rate of discharge of the voltage.

In another aspect, the circuit can further comprise a capacitor. The second node can be coupled to the capacitor. During operation, the capacitor can be discharged through the transistor.

In another aspect, the circuit can further comprise a capacitor. During operation, the capacitor can be recharged at a frequency that is dependent upon the rate of change of the voltage.

In another aspect, during operation, the capacitor can be charged at time determined by the change of state of the output of the comparator.

In another aspect, the capacitor can be charged for a pre-determined time after the change in state of the output of the comparator.

In another aspect, the circuit can further comprise a reference node to provide a reference voltage. The reference node can be charged at a time determined by the change of state of the output of the comparator.

In another aspect, during operation, the third node can be biased to place the transistor in a subthreshold region of operation to discharge a voltage of the second node at a rate dependent upon temperature. The output of the comparator changes state when the voltage of the second node discharges below the voltage of the first node.

In other embodiments, a method of operating a timer comprising operating a timer to provide pulses at a comparator output wherein a frequency of the pulses can be dependent on temperature. Providing each pulse includes biasing a first input of the comparator at a voltage; and operating a transistor in a subthreshold region of operation to change the voltage of the first input of a comparator at a rate dependent upon temperature. The output of the comparator changes state when the voltage of the first input crosses a voltage of a second input of the comparator.

In another aspect, the operating of a transistor in a sub-threshold region of operation to change the voltage of the first input of a comparator at a rate dependent upon temperature includes operating the transistor in a subthreshold region of operation to change the voltage of the first input of the comparator at a rate exponentially dependent upon temperature.

In another aspect, the method can further comprise using each pulse to refresh a reference voltage of a reference node.

In another aspect, the using of each pulse to refresh a reference voltage can include using each pulse to activate a band gap generator to provide a voltage to refresh the reference voltage. The band gap generator can be deactivated before being activated by a next successive pulse of the pulses.

In another aspect, the using of each pulse to refresh a reference voltage of a reference node can include charging a capacitor coupled to the reference node to refresh the reference voltage.

In another aspect, each pulse of the pulses can be used to bias the first input for producing the next successive pulse.

In another aspect, the first input can be coupled to a capacitor that is charged at times based on the pulses.

In another aspect, the operating of a transistor can include operating the transistor in a subthreshold region of operation to discharge the voltage of the first input of the comparator at a rate dependent upon temperature, the output of the comparator changes state when the voltage of the first input discharges below the voltage of the second input of the comparator.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or "B" (for "bar") following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans will appreciate that conductivity types and polarities of potentials may be reversed.

Although the disclosure is described herein with reference to specific embodiments, various modifications and changes can be made without departing from the scope of the present disclosure as set forth in the claims below. For example, N-channel transistor 205 can be replaced with a P-channel transistor, and corresponding changes in logic comparator 204. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit with a temperature dependent timer comprising:
   a comparator including a first input, a second input, and an output, the output to provide a timer signal during operation;
   a transistor including a first current terminal and a control terminal, the first current terminal coupled to the second input of the comparator;
   a first node coupled to the first input of the comparator;
   a second node coupled to the second input of the comparator and the first current terminal of the transistor;
   a third node coupled to the control terminal of the transistor;
   wherein during operation, the third node is biased to place the transistor in a subthreshold region of operation to change a voltage of the second node at a rate dependent upon temperature, the output of the comparator changes state when the voltage of the second node crosses a voltage of the first node.

2. The circuit of claim 1 wherein during operation, the third node is biased to place the transistor in a subthreshold region of operation to change a voltage of the second node at a rate exponentially dependent upon temperature.

3. The circuit of claim 1 further comprising a band gap generator, the change in state of the comparator output is utilized to activate the band gap generator to provide a voltage.

4. The circuit of claim 1 wherein during operation, the output of the comparator provides pulses, wherein a frequency of the pulses is dependent on temperature.

5. The circuit of claim 1 further comprising:
   a first capacitor including a first terminal coupled to the first node;
   a second capacitor including a first terminal coupled to the second node;
   a third capacitor including a first terminal coupled to the third node;
   a band gap generator, wherein the change in state of the output of the comparator is utilized to activate the band gap generator to provide a voltage at a generator output, wherein the voltage at the output is used to charge the first capacitor, the second capacitor, and the third capacitor for a period of time.

6. The circuit of claim 5 further comprising a first switch coupled between the generator output and the first capacitor, a second switch coupled between the generator output and the second capacitor, and a third switch coupled between the generator output and the third capacitor, wherein during operation, the first switch, the second switch, and the third switch are closed at a time based on the change of state of the output of the comparator to charge the first capacitor, the second capacitor, and the third capacitor respectively, with the voltage provided at the generator output.

7. The circuit of claim 6, wherein the generator output is coupled to a resistor ladder, the first switch is connected to a first node of the resistor ladder, the second switch is connected to a second node of the resistor ladder, and the third switch is connected to a third node of the resistor ladder.

8. The circuit of claim 4 further comprising:
   a first capacitor including a first terminal coupled to the first node;
   a second capacitor including a first terminal coupled to the second node;
   a third capacitor including a first terminal coupled to the third node;
   wherein during operation, the first capacitor, second capacitor, and third capacitor are charged at a frequency that is dependent upon the rate of discharge of the voltage.

9. The circuit of claim 1 further comprising a capacitor, the second node coupled to the capacitor, wherein during operation, the capacitor is discharged through the transistor.

10. The circuit of claim 1 further comprising a capacitor, wherein during operation, the capacitor is recharged at a frequency that is dependent upon the rate of change of the voltage.

11. The circuit of claim 10 wherein during operation, the capacitor is charged at time determined by the change of state of the output of the comparator.

12. The circuit of claim 11 wherein the capacitor is charged for a predetermined time after the change in state of the output of the comparator.

13. The circuit of claim 1 further comprising:
   a reference node to provide a reference voltage, wherein the reference node is charged at a time determined by the change of state of the output of the comparator.

14. The circuit of claim 1 wherein during operation, the third node is biased to place the transistor in a subthreshold region of operation to discharge a voltage of the second node at a rate dependent upon temperature, the output of the comparator changes state when the voltage of the second node discharges below the voltage of the first node.

15. A method of operating a timer, the method comprising:
   operating a timer to provide pulses at a comparator output wherein a frequency of the pulses is dependent on temperature, wherein providing each pulse of the pulses includes:
   biasing a first input of the comparator at a voltage;
   operating a transistor in a subthreshold region of operation to change the voltage of the first input of a comparator at a rate dependent upon temperature, the output of the comparator changes state when the voltage of the first input crosses a voltage of a second input of the comparator.

16. The method of claim 15 wherein the operating a transistor in a subthreshold region of operation to change the voltage of the first input of a comparator at a rate dependent upon temperature includes operating the transistor in a subthreshold region of operation to change the voltage of the first input of the comparator at a rate exponentially dependent upon temperature.

17. The method of claim 15 further comprising using each pulse to refresh a reference voltage of a reference node.

18. The method of claim 17 wherein the using each pulse to refresh a reference voltage includes using each pulse to activate a band gap generator to provide a voltage to refresh the reference voltage, wherein the band gap generator is deactivated before being activated by a next successive pulse of the pulses.

19. The method of claim 17 wherein the using each pulse to refresh a reference voltage of a reference node includes charging a capacitor coupled to the reference node to refresh the reference voltage.

20. The method of claim 15 wherein each pulse of the pulses is used to bias the first input for producing the next successive pulse.

21. The method of claim 20 wherein the first input is coupled to a capacitor that is charged at times based on the pulses.

22. The method of claim 15 wherein the operating a transistor includes operating the transistor in a subthreshold region of operation to discharge the voltage of the first input of the comparator at a rate dependent upon temperature, the output of the comparator changes state when the voltage of the first input discharges below the voltage of the second input of the comparator.

* * * * *